United States Patent [19]
Venkatesan et al.

[11] Patent Number: 5,371,382
[45] Date of Patent: Dec. 6, 1994

[54] AMORPHOUS SILICON RECTIFYING CONTACT ON DIAMOND AND METHOD FOR MAKING SAME

[75] Inventors: Vasudev Venkatesan, Raleigh; Dale G. Thompson, Chapel Hill; Kalyankumar Das, Raleigh, all of N.C.

[73] Assignee: Kobe Steel USA, Inc., Research Triangle Park, N.C.

[21] Appl. No.: 874,637

[22] Filed: Apr. 27, 1992

[51] Int. Cl.$^5$ .................. H01L 45/00; H01L 29/48; H01L 29/161; H01L 29/20
[52] U.S. Cl. ........................................ 257/77; 257/52; 257/200; 257/607; 257/655
[58] Field of Search .............. 257/77, 52, 471, 607, 257/613, 655, 183, 200

[56] References Cited

U.S. PATENT DOCUMENTS

| | | | |
|---|---|---|---|
| 4,982,243 | 1/1991 | Nakahata et al. | 357/15 |
| 5,012,476 | 4/1991 | Razeghi et al. | 372/45 |
| 5,075,757 | 12/1991 | Ishii et al. | 357/67 |
| 5,155,559 | 10/1992 | Humphreys et al. | 437/175 |
| 5,202,571 | 4/1993 | Hirabayashi et al. | 257/77 |
| 5,252,840 | 10/1993 | Shiomi et al. | 257/77 |

OTHER PUBLICATIONS

Gildenblat, et al., "Electrical Characteristics of Schottky Diodes Fabricated Using Plasma Assisted Chemical Vapor Deposited Diamond Films", Appl. Phys. Lett. 53 (7), pp. 586–589, Aug. 1988.
Gildenblat, et al., "The Effect of Surface Treatment on the Electrical Properties of Metal Contacts to Boron--Doped Homoepitaxial Diamond Film", IEEE Electron Device Letters, vol. 11, pp. 100–102, No. 2, Feb. 1990.
Geis, "Diamond Transistor Performance and Fabrication", Proceedings of the IEEE, vol. 79, No. 5, pp. 669–676, May, 1991.
Nishimura, et al., "Material and Electrical Characterization of Poly-Crystalline Boron-Doped Diamond Films Grown By Microwave Plasma Chemical Vapor Deposition", J. Appl. Phys. 69 (5), pp. 3142–3149, Mar., 1991.
Glover, "The C–V Characteristics of Schottky Barriers on Laboratory Grown Semiconducting Diamonds", Solid State Electronics, vol. 16, pp. 973–983, 1973.
Prins, "Preparation of Ohmic Contacts To Semiconducting Diamond", pp. 1562–1564, Jul. 5, 1989.
Wolf, et al., "Silicon Processing For The VLSI Era", vol. I, Process Technology, pp. 175–182, Jun., 1987.
Shimoni, et al., "Electrical Characteristics of Metal Contacts to Boron-Doped Diamond Epitaxial Film", pp. 758–762, Mar., 1989.

Primary Examiner—Mark V. Prenty
Attorney, Agent, or Firm—Bell, Seltzer, Park & Gibson

[57] ABSTRACT

A rectifying contact for use at high temperatures includes a semiconducting diamond layer and a doped amorphous silicon layer thereon. The amorphous silicon layer may be doped with either a p-type or n-type dopant. The semiconducting diamond may be a doped polycrystalline diamond layer or a natural IIb single crystal diamond. The amorphous silicon layer may be formed by sputter deposition from doped silicon targets. A subsequent heating of the thus formed rectifying contact lowers the forward resistance of the contact by activating additional dopant atoms within the amorphous silicon layer.

16 Claims, 2 Drawing Sheets

AMORPHOUS SILICON RECTIFYING CONTACT ON DIAMOND AND METHOD FOR MAKING SAME

FIELD OF THE INVENTION

This invention relates to semiconductor devices, and more particularly, to a high temperature rectifying contact for semiconductor devices.

BACKGROUND OF THE INVENTION

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using conventional Si, Ge, or GaAs.

Silicon as a semiconductor material is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material.

Because of the advantages of diamond as a material for semiconductor devices, there is at present an interest in the growth and use of diamond for high temperature and radiation-hardened electronic devices. Consequently, the fabrication of rectifying contacts, that is, Schottky contacts, on diamond will play an important role in the development of future diamond-based devices.

It has been demonstrated previously that gold (Au) or tungsten (W) contacts on a diamond layer provide rectification at temperatures of up to 400° C. Unfortunately, the adhesion of these layers to the diamond, particularly at high temperatures, is often poor. Other rectifying contacts are also known. For example, U.S. Pat. No. 4,982,243 to Nakahata et al. discloses a Schottky contact which includes a monocrystalline diamond substrate, an epitaxial monocrystalline diamond layer on the substrate, and a Schottky electrode layer formed on the diamond layer. The Schottky electrode layer has a preferred thickness of 0.05 microns to 5 microns and is preferably of tungsten, molybdenum, niobium, tantalum, aluminum, polycrystalline silicon, nickel, gold, platinum, tungsten carbide, tungsten silicide or molybdenum silicide. In addition, the Schottky electrode layer may be formed on the epitaxial diamond layer by vacuum evaporation, chemical vapor deposition (CVD), or plasma CVD. The diamond layer is epitaxially grown on the surface of the monocrystalline diamond substrate, which surface inclines at an angle of not greater than 10° to the (100) plane. The surface of the substrate is polished to produce the required uniformity of the diamond substrate.

The prior art has been limited to rectifying operation of contacts at relatively low temperatures, and also limited by poor adhesion of the metal contact layer to the diamond at elevated temperatures. In addition, there is a need for better device performance characterized by lower reverse leakage current and higher breakdown voltage.

SUMMARY OF THE INVENTION

It is therefore an object of the present invention to provide a stable high temperature rectifying contact on diamond and a method for making the contact.

This and other objects, features, and advantages according to the present invention are provided by a doped amorphous silicon layer on a semiconducting diamond layer thereby forming a rectifying contact. The semiconducting diamond layer may be provided by a natural IIb single crystal diamond or may also be a doped polycrystalline diamond layer formed on a supporting substrate by conventional chemical vapor deposition (CVD). In a preferred embodiment of the invention, the semiconducting diamond layer is preferably provided by a Boron-doped polycrystalline layer formed on a substrate, such as silicon, by conventional CVD techniques. The polycrystalline diamond rectifying contact is less expensive than a rectifying contact using a suitable single crystal diamond.

Boron is preferably used as the dopant for the semiconducting polycrystalline diamond. The polycrystalline diamond layer or natural diamond preferably has a dopant concentration of not greater than about $10^{18}$ atoms/cm$^3$ and more preferably in the range of from about $10^{16}$ to $10^{17}$ atoms/cm$^3$. If the diamond layer is highly doped, the amorphous silicon layer will likely function as an ohmic contact with the highly doped diamond layer rather than a rectifying contact as in the present invention. An ohmic contact using amorphous silicon and other types of silicon on diamond is disclosed in U.S. Pat. No. 5,075,757 to Ishii et al. and entitled Ohmic Contact Electrodes for Semiconductor Diamonds.

The doped amorphous silicon layer of the present invention is preferably highly doped to a concentration greater than about $10^{19}$ atoms/cm$^3$ with either a p-type or an n-type dopant. The p-type dopant for the amorphous silicon layer is preferably selected from Group IIIb elements, such as, for example, Boron and Aluminum; and the n-type dopant is preferably selected from the Group Va elements, such as, for example, Arsenic, Phosphorous, and Antimony.

Although silicon as a semiconductor material is typically limited to operation at below about 200° C. due to its relatively low energy band gap, in the rectifying contact according to the present invention, the amorphous silicon layer is being used as a conductor rather than a semiconductor. Accordingly, relatively high temperature operation up to about 400° C. is achievable by the amorphous silicon layer on diamond.

Another aspect according to the present invention is the reduction of the forward resistance of the rectifying contact by a subsequent heating step which serves to activate additional dopant atoms positioned within the amorphous silicon layer. The heating is carried out at a temperature of about 400° C. to 550° C. and for a time of about ½ hour to 1 hour.

The rectifying contact according to the present invention has applicability in many semiconductor devices, such as diodes or gate contacts for field effect transistors, and in other devices where a stable high temperature rectifying contact up to at least about 400° C. is required. The rectifying contact according to the invention has good mechanical adhesion between the amorphous silicon layer and the semiconducting diamond layer unlike certain metal rectifying contacts of the prior art. In addition, the rectifying contact including the amorphous silicon layer exhibits low reverse leakage current and a high breakdown voltage.

DETAILED DESCRIPTION OF THE PREFERRED EMBODIMENTS

Figure 1:
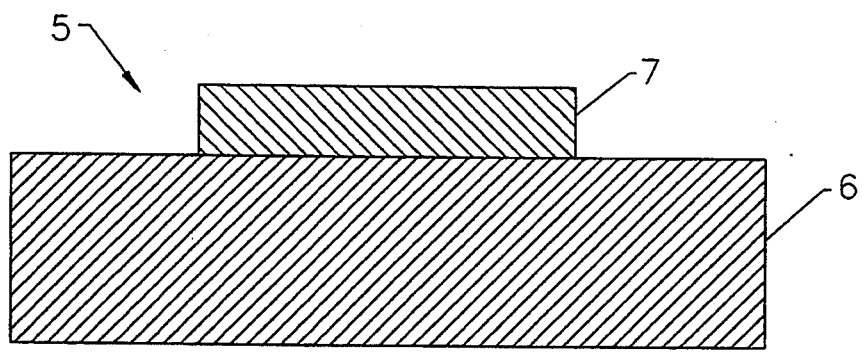
FIG. 1 is a cross-sectional side view of an embodiment of a rectifying contact according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, Applicants provide these embodiments so that this disclosure will be thorough and complete, and will fully convey the scope of the invention to those skilled in the art. Prime notation and like numerals are used to refer to like elements throughout. In the drawings, the thickness of layers and regions are exaggerated for clarity.

As shown in the cross-sectional view of FIG. 1, the rectifying contact according to the invention is shown generally designated by reference numeral 5. The rectifying contact 5 includes a semiconducting diamond layer 6 and a highly doped amorphous silicon layer 7 thereon. The doped amorphous silicon layer 7 forms a rectifying contact with the semiconducting diamond layer 6. As would be readily understood by those skilled in the art, the rectifying contact 5 according to the present invention has applicability in many semiconductor devices, such as diodes or gate contacts for field effect transistors, especially in such devices where stable high temperature operation is required.

Figure 2:
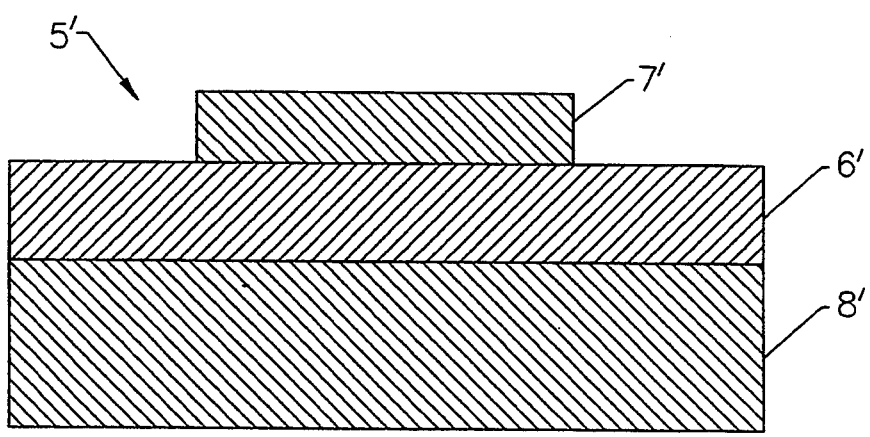
FIG. 2 is a cross-sectional side view of another embodiment of a rectifying contact according to the present invention.

The semiconducting diamond layer 6 may be a natural IIb single crystal diamond, but may also be a Boron-doped single crystal or polycrystalline diamond layer formed by conventional CVD techniques. As shown in the illustrated embodiment of FIG. 2, a rectifying contact 5' according to the invention may include a substrate 8', such as a silicon substrate, upon which a Boron-doped polycrystalline diamond layer 6' is formed by conventional CVD techniques. The rectifying contact 5' also includes the doped amorphous silicon layer 7' on the polycrystalline diamond layer 6'. As would be readily understood by those skilled in the art, the polycrystalline diamond layer 6' is less expensive than a suitable single crystal diamond.

In both illustrated embodiments of the invention, the doped amorphous silicon layer 7, 7' is preferably sputter deposited from one or more highly doped silicon targets (not shown) as would be readily understood by those skilled in the art. A p-type dopant for the amorphous silicon layer 7, 7' is preferably selected from the Group IIIb elements, such as preferably Boron (B) or Aluminum (Al). An n-type dopant is preferably selected from the Group Va elements, such as Arsenic (As), Phosphorous (P), and Antimony (Sb).

It has also been found according to the invention that the p-type or n-type dopant concentration is preferably not less than about $10^{19}$ atoms/cm$^3$ for good rectifying operation of the contact 5, 5'. Such doping concentration levels may be readily achieved by sputter deposition using commercially available doped silicon targets, such as those available from the Virginia Semiconductor Company in Fredericksburg, Va.

In the preferred embodiments of the rectifying contacts 5, 5' according to the invention, the concentration of dopant atoms in either the natural diamond layer 6 or the doped polycrystalline diamond layer 6' is preferably not greater than about $10^{19}$ atoms/cm$^3$, and more preferably in the range of about $10^{16}$ to $10^{17}$ atoms/cm$^3$. A highly doped diamond layer will likely function as an ohmic contact, rather than a rectifying contact as in the present invention. U.S. Pat. No. 5,075,757 to Ishii et al. and entitled Ohmic Contact Electrodes for Semiconductor Diamonds discloses ohmic contacts formed using polycrystalline silicon and also amorphous silicon including microcrystalline silicon phase.

It has been found according to another aspect of the invention, that the rectifying contact 5, 5' may be advantageously heated to a predetermined temperature for a predetermined time to thereby reduce the forward resistance of the contact. In particular, it has been found that the contact 5, 5' may be advantageously heated to a temperature in the range of about 400° C. to 550° C. for a time of about ½ hour to 1 hour to activate additional dopant atoms within the amorphous silicon layer 7, 7' and thereby reduce the resistance of the contact.

Applicants theorize without wishing to be bound thereto, that current conduction in the diamond layer 6, 6' of the rectifying contact 5, 5' is space charge limited. Space charge limited current flow in insulators and wide band gap semiconductors has been considered in detail in the technical literature. See, for example, Lampert and Mark, *Current Injection in Solids*, (Academic Press, Inc., New York, N.Y., 1970, pp. 18-24). In general, in an insulator or a wide band gap semiconductor such as diamond, the sharp rise in current is obtained when all the deep traps are filled. The voltage at which the sharp rise in current occurs, that is, the trap filled limit ($V_{TFL}$) may be expressed as:

$$V_{TFL} \sim \frac{q n_{t0} L^2}{\epsilon_r \epsilon_0} \qquad (1)$$

where $n_{t0}$ is the electron occupancy of the traps in the active region of the rectifying contact, L is the thickness of the active region, q is the electronic charge, $\epsilon_r$ is the dielectric constant and $\epsilon_0$ is the permitivity of free space.

The effective carrier concentration, $p_o$, in the active region is given by:

$$\frac{J(2\ V_{TFL})}{J(V_{TFL})} \sim \frac{n_{t0}}{p_o} \quad (2)$$

where J is the current density. The effective carrier concentration determines the position of the quasi Fermi level. The position of the deep level is taken as being within kT of the quasi Fermi level. From the estimated values of $V_{TFL}$ of 0.13V and 0.22V, the concentration of unoccupied states, $n_{t0}$ was calculated using Eq. 1 as $5.7 \times 10^{14}$ cm$^{-3}$ and $9.7 \times 10^{14}$ cm$^{-3}$, respectively. In deep level calculations, zero bias capacitance of 36 pF measured at 1 KHz, a thickness of the active region of the contact of $2.63 \times 10^{-5}$ cm and an area of $1.96 \times 10^{-3}$ cm$^2$ have been used. The effective carrier concentrations, $p_0$ were calculated using eq. 2 to be $3 \times 10^{13}$ cm$^{-3}$ ($V_{TFL}=0.13V$) and $5.8 \times 10^{12}$ cm$^{-3}$ ($V_{TFL}=0.22V$). The approximate position of the deep level states is the quasi Fermi level determined by $p_0$. These levels ave been calculated to be 0.54 eV ($V_{TFL}=0.13V$) and 0.59 eV ($V_{TFL}=0.22V$) above the valence band. In fact, $n_{t0}$ is the concentration of the occupied states located approximately at the calculated quasi Fermi level.

Space charge limited current conduction in diamond has been reported and parameters pertaining to the deep-level states have been extracted by a number of authors. See, for example, Ashok et al., Appl. Phys. Lett. 50, p. 763, (1987); Albin et al., IEEE Electron. Dev. Lett. 11, p. 159, (1990); Okumura et al., Appl. Phys. Lett., 57, p. 1907, (1991); Mort et al., Appl. Phys. Lett. 59, p. 455, (1991); Muto et al., Appl. Phys. Lett. 59, p. 843, (1991); and Gomez-Yanez et al., J. Appl. Phys., 71, p. 2303, (1991). From photoemission studies on diamond thin films, the presence of high densities of two types of deep-level states have been reported. (See, Okumura et al., Appl. Phys. Lett., 57, p. 1907, (1991)). The first type of states are ionized acceptors which are electron filled and extending about 0.5 eV above the valence band. The second type are un-ionized acceptor states extending another 0.5 to 1.0 eV above the filled states. In polycrystalline diamond films, the presence of localized states have been reported in the energy range of 0.6 to 0.8 eV above the valence band. (See, Mort et al., Appl. Phys. Lett. 59, p. 455, (1991)). Muto et al. have reported deep level traps at 0.93 eV above the valence band in undoped diamond films. (See, Muto et al., Appl. Phys. Lett. 59, p. 843, (1991)).

The following Example is included as illustrative of the present invention without being limiting thereof.

Example

Natural IIb semiconducting diamond substrates were polished and thoroughly cleaned to remove any graphitized layer left on the surface due to polishing. A solution of $CrO_3+H_2SO_4$ heated to about 200° C. was used to remove any graphite on the surfaces of the diamond single crystal substrate. These samples were subsequently cleaned in aqua regia ($3HCL+HNO_3$) and standard RCA solutions. The RCA solutions are (1) $H_2O_2$:$NH_4OH$:$H_2O$ (1:1:5), and (2) $H_2O_2$:$HCL$:$H_2O$ (1:1:5), wherein the solutions are used at a temperature of 75° C. to 80° C. one after the other with a deionized water rinse in between. (See, Kern et al., RCA Review, Vol. 31, p. 187 (1970)). A dehydration bake at 120° C. for 20 minutes was performed to remove any remaining moisture from the samples.

Sputter deposited B-doped and As-doped amorphous silicon contacts about 2000 Å thick were formed on the natural IIb diamond samples. The amorphous silicon layers were deposited by RF sputtering of low resistivity targets using Argon (Ar) as the sputtering gas. The targets used for depositing the B-doped silicon and the As-doped silicon were highly B-doped silicon (100) and highly As-doped silicon (100), respectively. A photoresist lift-off process was used to define 100μm circular active diode areas separated from field regions by 100μm wide circular rings. Current-voltage measurements were performed from room temperature up to about 400° C.

Resistivities of the thus deposited B-doped and As-doped amorphous silicon layers were measured to be $224 \pm 12$ and $326 \pm 53$ ohms cm, respectively. The atomic As concentration in the sputtered As-doped amorphous silicon layer, as measured by secondary ion mass spectroscopy (SIMS) analysis, was about $2 \times 10^{19}$ atoms/cm$^3$. This Arsenic concentration was uniform over the entire thickness of the sputtered amorphous silicon layer. Again, SIMS analysis of the sputtered B-doped amorphous silicon layer indicated a uniform atomic concentration of Boron of about $8 \times 10^{19}$ atoms/cm$^3$ over the entire layer thickness.

Figure 3:
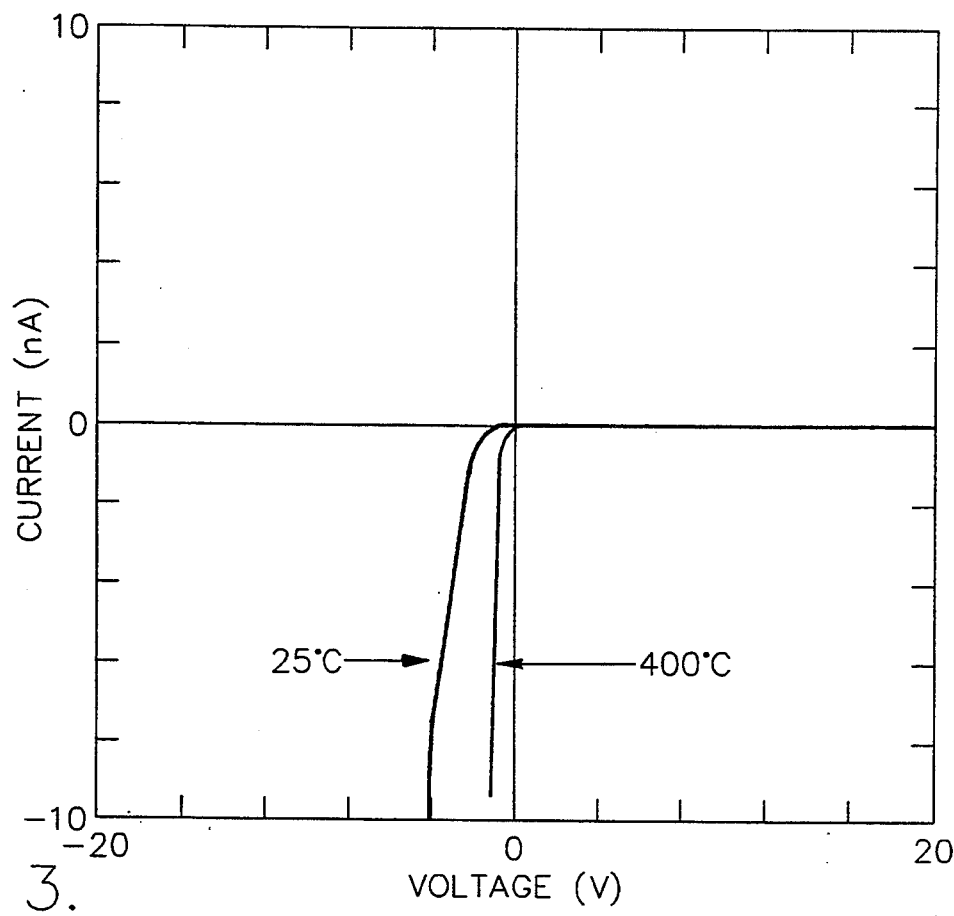
FIG. 3 is a graph indicating the current versus voltage characteristics of a rectifying contact according to the present invention including a Boron-doped amorphous silicon layer at temperatures of about 25° C. and about 400° C.
Figure 4:
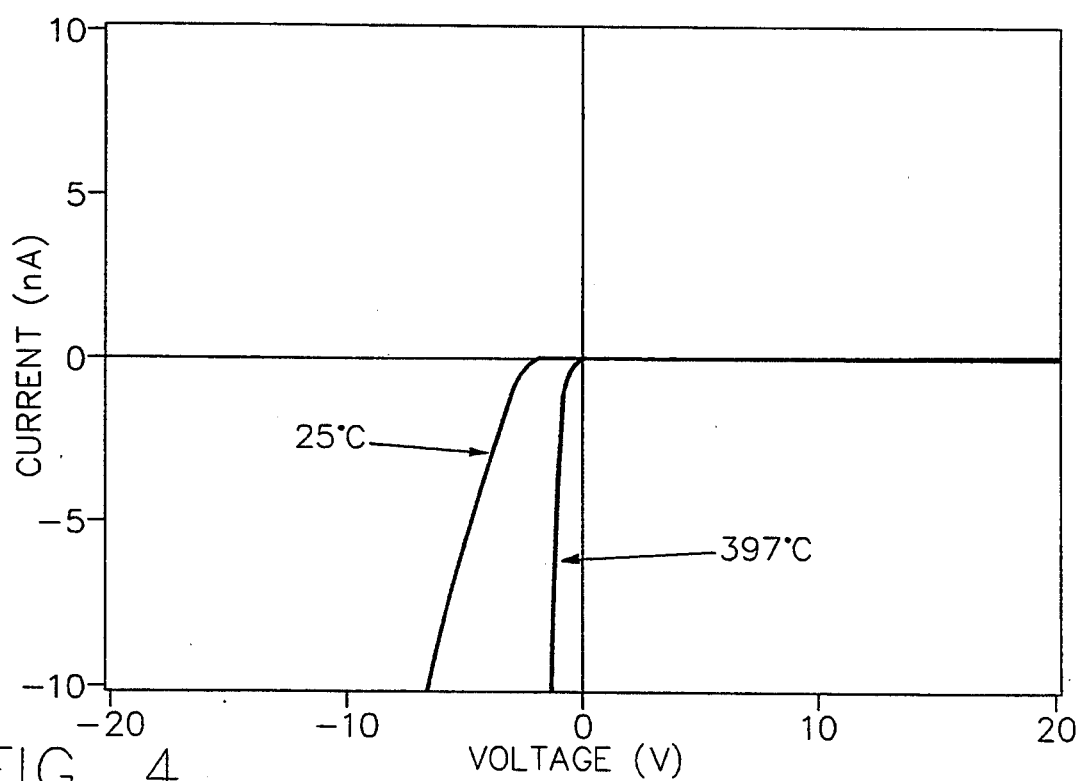
FIG. 4 is a graph indicating the current versus voltage characteristics of a rectifying contact according to the present invention including an Arsenic-doped amorphous silicon layer at temperatures of about 25° C. and about 400° C.

FIGS. 3 and 4 show graphs of current versus voltage measurements for the B-doped amorphous silicon layer and As-doped amorphous silicon layers, respectively, at temperatures of about 25° C. and 400° C. as noted on the graphs. The reverse leakage current for the B-doped amorphous silicon contact was 0.1 pA at 25° C. and 72 pA at 400° C. The reverse leakage current for the As-doped amorphous silicon contact was 0.2 pA at 25° C. and 132.0 pA at 397° C.

Current versus voltage measurements of the sputtered amorphous silicon contacts showed excellent rectification. Reverse leakage current densities at about 400° C. of $9 \times 10^{-7}$ A/cm$^2$ and $2 \times 10^{-6}$ A/cm$^2$ at 20V were measured for the B-doped and As-doped contacts, respectively. Applicants theorize that space charge limited current conduction was observed in As-doped and B-doped amorphous silicon contacts on diamond.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A rectifying contact for a semiconductor device, said rectifying contact comprising:

a semiconducting diamond layer having a dopant concentration of not greater than about $10^{18}$ atoms/cm$^3$; and a doped amorphous silicon layer on said diamond layer and forming a rectifying contact therewith, said doped amorphous silicon layer being doped with a p-type dopant having a dopant concentration of not less than about $10^{19}$ atoms/cm$^3$.

2. A rectifying contact according to claim 1 wherein said semiconducting diamond layer has a dopant concentration in the range of $10^{16}$ to $10^{17}$ atoms/cm$^3$ to thereby form a rectifying contact with said doped amorphous silicon layer.

3. A rectifying contact according to claim 1 wherein said p-type dopant is selected from the group consisting of Group IIIb elements.

4. A rectifying contact according to claim 1 wherein said diamond layer comprises single crystal diamond.

5. A rectifying contact according to claim 4 wherein said single crystal diamond layer is natural IIb diamond.

6. A rectifying contact for a semiconductor device, said rectifying contact comprising:
    a polycrystalline semiconducting diamond layer having a dopant concentration of not greater than about $10^{18}$ atoms/cm$^3$; and
    a doped amorphous silicon layer on said diamond layer and forming a rectifying contact therewith, said doped amorphous silicon layer being doped with a p-type dopant having a dopant concentration of not less than about $10^{19}$ atoms/cm$^3$.

7. A rectifying contact according to claim 6 wherein said semiconducting diamond layer has a dopant concentration in the range of $10^{16}$ to $10^{17}$ atoms/cm$^3$ to thereby form a rectifying contact with said doped amorphous silicon layer.

8. A rectifying contact according to claim 6 wherein said p-type dopant is selected from the group consisting of Group IIIb elements.

9. A rectifying contact for a semiconductor device, said rectifying contact comprising:
    a semiconducting diamond layer; and
    a doped amorphous silicon layer on said diamond layer and forming a rectifying contact therewith, said doped amorphous silicon layer having a p-type dopant concentration of not less than about $10^{19}$ atoms/cm$^3$.

10. A rectifying contact according to claim 9 wherein said semiconducting diamond layer has a dopant concentration in the range of $10^{16}$ to $10^{17}$ atoms/cm$^3$ to thereby form a rectifying contact with said doped amorphous silicon layer.

11. A rectifying contact according to claim 9 wherein said p-type dopant is selected from the group consisting of Group IIIb elements.

12. A rectifying contact according to claim 9 wherein said diamond layer comprises single crystal diamond.

13. A rectifying contact according to claim 12 wherein said single crystal diamond layer is natural IIb diamond.

14. A rectifying contact for a semiconductor device, said rectifying contact comprising:
    a polycrystalline semiconducting diamond layer; and
    a doped amorphous silicon layer on said diamond layer and forming a rectifying contact therewith, said doped amorphous silicon layer having a p-type dopant concentration of not less than about $10^{19}$ atoms/cm$^3$.

15. A rectifying contact according to claim 14 wherein said semiconducting diamond layer has a dopant concentration in the range of $10^{16}$ to $10^{17}$ atoms/cm$^3$ to thereby form a rectifying contact with said doped amorphous silicon layer.

16. A rectifying contact according to claim 14 wherein said p-type dopant is selected from the group consisting of Group IIIb elements.

* * * * *